United States Patent
Zhou et al.

(10) Patent No.: US 9,219,468 B2
(45) Date of Patent: Dec. 22, 2015

(54) FAILURE DETECTOR CIRCUIT AND ASSOCIATED METHOD

(71) Applicant: Chengdu Monolithic Power Systems Co., Ltd., Chengdu (CN)

(72) Inventors: Jiangyun Zhou, Chengdu (CN); Yike Li, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 407 days.

(21) Appl. No.: 13/708,892

(22) Filed: Dec. 7, 2012

(65) Prior Publication Data

US 2013/0147537 A1   Jun. 13, 2013

(30) Foreign Application Priority Data

Dec. 7, 2011   (CN) .......................... 2011 1 0403342

(51) Int. Cl.
*H02H 7/00*        (2006.01)
*H02H 9/00*        (2006.01)
*H03H 11/26*       (2006.01)
*H03K 5/19*        (2006.01)
*G01R 31/317*      (2006.01)

(52) U.S. Cl.
CPC ............... *H03H 11/265* (2013.01); *H03K 5/19* (2013.01); *G01R 31/31721* (2013.01)

(58) Field of Classification Search
USPC ........................................... 361/18
See application file for complete search history.

(56) References Cited

U.S. PATENT DOCUMENTS 6,631,066 B1 * 10/2003 Smith et al. .................... 361/103
2011/0261492 A1 * 10/2011 Lu et al. ........................ 361/79

* cited by examiner

*Primary Examiner* — Dharti Patel
(74) *Attorney, Agent, or Firm* — Perkins Coie LLP

(57) ABSTRACT

A failure detector circuit for detecting status of a protected circuit, the failure detector circuit having an operating cycle, has an enabling signal generator, a comparator circuit, a delay circuit. The enabling signal generator enables the comparator for an enable time in each operating cycle. The comparator circuit compares an output of the protected circuit with a reference signal. The delay circuit receives an output signal of the comparator to decide whether a failure occurred within a give delay time.

19 Claims, 3 Drawing Sheets

US 9,219,468 B2

FAILURE DETECTOR CIRCUIT AND ASSOCIATED METHOD

CROSS-REFERENCE TO RELATED APPLICATION(S)

This application claims the benefit of CN application No. 201110403342.4, filed on Dec. 7, 2011, and incorporated herein by reference.

TECHNICAL FIELD

The present invention generally relates to power supply, and particularly but not exclusively relates to a failure detector circuit and associated method.

BACKGROUND

In applications of switch-mode power supply and battery power supply circuit, circuit protection, for example, over-voltage protection (OVP), over-current protection (OCP) or over-temperature protection (OTP) is important. In prior art, a control chip is applied to monitor the voltage, current, temperature or other parameters of the protected circuit and thereby protects it. Since the control chip needs to consume quiescent current, it directly affects the operating efficiency of the protected circuit.

In prior art, the operating efficiency of circuit is generally improved through decreasing the quiescent current. However, the degree of decreasing quiescent current is limited. Therefore, the improvement of the operating efficiency is constrained.

SUMMARY

One embodiment of the present invention discloses a failure detector circuit for detecting status of a protected circuit, the failure detector circuit comprising: an enabling signal generator, generating a periodic enabling signal which has an operating cycle, configured to indicate an enable time in every operating cycle; a comparator circuit, having an enabling terminal, two input terminals and a output terminal, wherein a enabling terminal receives the enabling signal, and wherein the two input terminals respectively receive an output signal from a protected circuit and a reference signal, and wherein the output terminal generates a comparative result signal according to the enabling signal, the output signal and the reference signal; and a delay circuit, receiving and detecting the comparative result signal for a given delay period, generating a delay signal according to the comparative result signal, wherein the given delay period is larger than the operating cycle.

BRIEF DESCRIPTION OF THE DRAWINGS

Non-limiting and non-exhaustive embodiments are described with reference to the following drawings. The drawings are not depicted to scale and only for illustration purpose.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
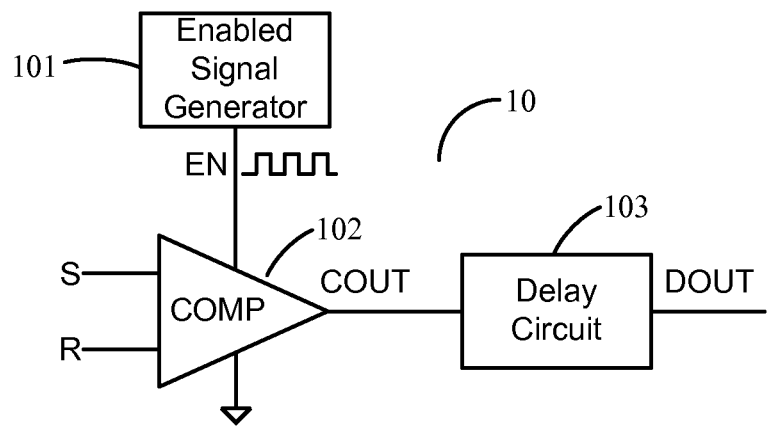
FIG. 1 illustrates a failure detector circuit 10 according to an embodiment of the present invention.

FIG. 1 illustrates a failure detector circuit 10 according to an embodiment of the present invention. As shown in FIG. 1, the failure detector 10 comprises an enabling signal generator 101, a comparator 102 and a delay circuit 103.

Enabling signal generator 101 generates a periodical enabling signal EN, In one embodiment, the enabling signal EN is a square-wave signal which has an operating cycle T, and the enable time in each cycle is Te, Te<T. Comparator 102 receives an output signal S from a protected circuit (not shown in FIG. 1), and a reference signal R. An enabling terminal of the comparator 102 receives the enabling signal EN. Comparator 102 generates a comparative result signal COUT according to the output signal S, the reference signal R and the enabling signal EN. Delay circuit 103 receives the comparative signal COUT and monitors the states of the comparative result signal COUT in a given delay period Td, so that provides a delay signal DOUT to a failure protection circuit (not shown in FIG. 1). The given delay period Td may be set according to the requirement of user, and is longer than the operating cycle T of the enabling signal EN (Td>T).

Figure 2:
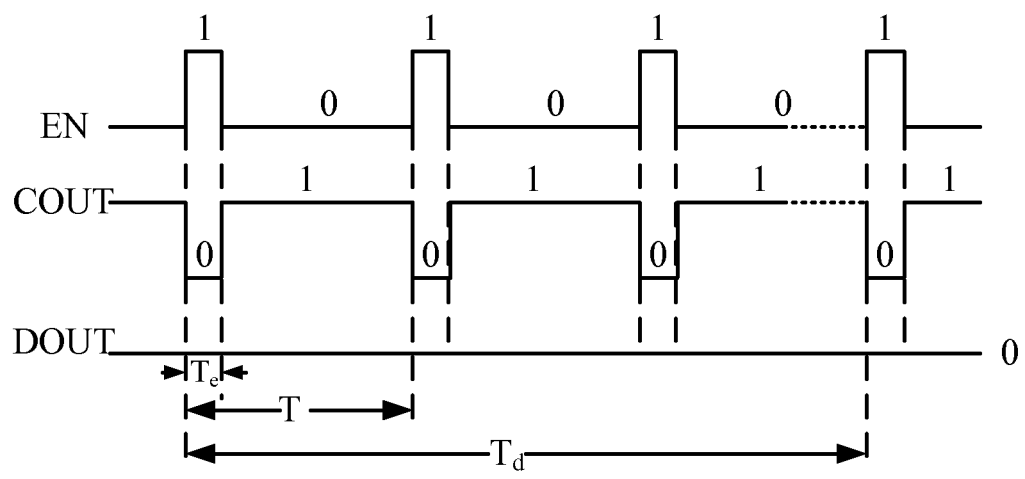
FIG. 2 illustrates a schematic wave-form diagram of the failure detector circuit 10 according to the embodiment shown in FIG. 1 when the protected circuit is in normal status.
Figure 3:
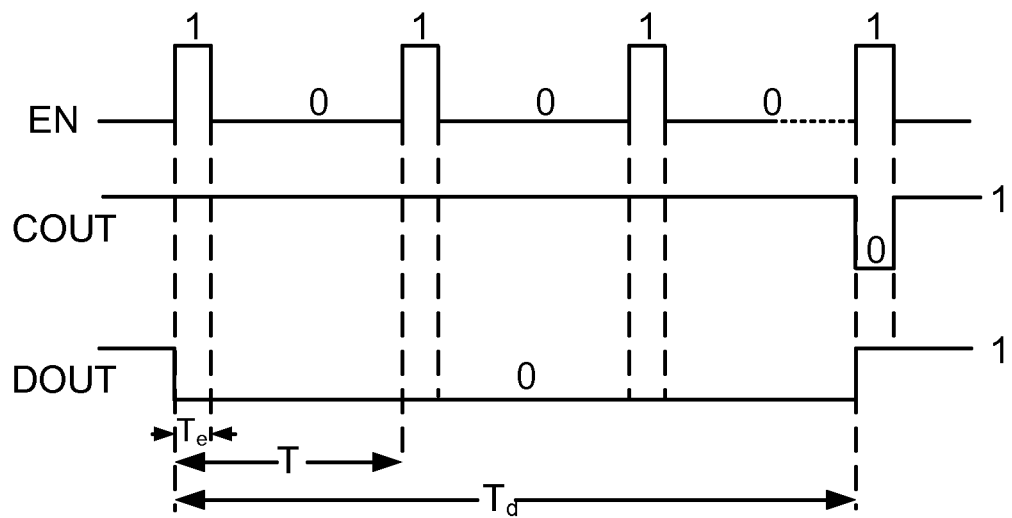
FIG. 3 illustrates a schematic wave-form diagram of the failure detector circuit 10 according to the embodiment shown in FIG. 1 when the protected circuit is in failure.

For further illustrating the failure detector circuit 10 shown in FIG. 1 in detail, FIG. 2 and FIG. 3 illustrate schematic wave-form diagrams of the failure detector circuit 10 according to the embodiment shown in FIG. 1. As shown in FIG. 2 and FIG. 3, from top to bottom, the schematic waveform curves in turn represent the enabling signal EN, the comparative result signal GOUT and the delay signal DOUT. The enabling signal EN is a square wave signal with the operating cycle T, and the enabled time in each operating cycle is Te. In the embodiment in FIG. 2 and FIG. 3, the square wave signal is active high, which means during the enable time Te, EN=1. Otherwise the square wave signal is at low level, i.e. EN=0.

In the embodiments shown in FIG. 2 and FIG. 3, when the enabling signal EN is at low level, comparator 102 is out of operation, and the comparative result signal GOUT is originally set to high level. When the enabling signal EN turns to high, comparator 102 is in operation to compare the output signal S from the protected circuit with the reference signal R. In an exemplar, the comparative result signal GOUT is at low level when the protected circuit is operating normally, while the comparative result signal GOUT is at high level when the protected circuit is suffering a failure. Then delay circuit 103 detects the value of comparative result signal GOUT during the given delay period Td. If the comparative result signal GOUT keeps in high level during the given delay period Td, it indicates that the protected circuit is in failure, and the delay signal DOUT provided by delay circuit 103 is at high level to initiate the failure protection circuit. Once the comparative result signal GOUT emerges at low level during the given delay period Td, the failure detector circuit 10 decides that the protected circuit is operating normally. Delay circuit 103 generates a low level delay signal DOUT to disable the failure protection circuit.

FIG. 2 illustrates a schematic wave-form diagram of the failure detector circuit 10 according to the embodiment shown in FIG. 1 when the protected circuit is operating in normal status. At normal, when EN=1, comparator circuit 102 operates to compare the output signal S of the protected circuit with the reference signal S, configured to obtain a low level comparative result signal COUT, COUT=0. While EN=0, comparator circuit 102 is disabled, and the comparative result signal COUT is set to high level, COUT=1. During the given delay period Td, once the comparative result signal COUT emerges at low level when EN=1, the failure detector circuit 10 considers that the protected circuit is operating normally, DOUT=1, and the failure protection circuit is disabled.

FIG. 3 illustrates a schematic wave-form diagram of the failure detector circuit 10 according to the embodiment shown in FIG. 1 when the protected circuit is in failure. In failure status, when EN=1, comparator circuit 102 operates to compare the output signal S of the protected circuit with the reference signal S, configured to obtain a high level comparative result signal COUT, COUT=1. While EN=0, the comparative result signal COUT is set to high level, COUT=1. Therefore in failure status, the comparator result signal COUT always maintains at high level during the given delay period Td. The delay circuit 103 generates a high level delay signal, DOUT=1, and the failure detector circuit 10 initiates the failure protection circuit.

The failure detector circuit in prior art generally keeps on during a whole operating cycle T, and consumes quiescent current ISS. For the embodiment shown in FIG. 1, the failure detector circuit 10 receives the enabling signal EN, and is on during the enabled time Te of the operating cycle T. Thus, the consumed quiescent current I'ss is $$I'ss = \frac{Te}{T} Iss$$

For an instance, if the operating cycle T=1 ms, and the enable time Te=10 us (the enable time is 1% of operating cycle), the consumed quiescent current of the embodiments in present invention may be just 1% of the consumed quiescent current of prior art. And the bias current of the failure detector circuit 10 still maintains to ISS to guarantee the normal operation of the failure detector circuit 10. Accordingly, the failure detector circuit according to the embodiments of the present invention may consume much less quiescent current so that improves the circuit efficiency.

One with ordinary skill in the art should understand the failure detector circuit according to the embodiments may be applied to detect the failure of over-voltage, over-current, over-temperature or other failure status on the protected circuit. Correspondingly, the output signal S of the protected circuit and the reference signal R, which are received by comparator circuit 102, are signals that monitor voltage, current, temperature or other parameters in the protected circuit.

Figure 4:
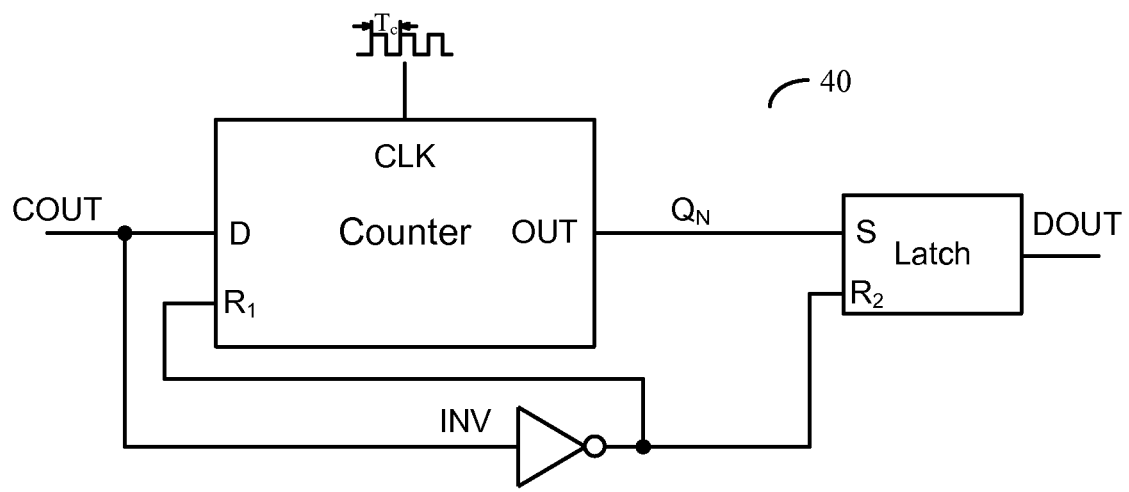
FIG. 4 schematically illustrates a circuitry of a delay circuit 40 according to an embodiment of the present invention.

FIG. 4 schematically illustrates a circuitry of a delay circuit 40 according to an embodiment of the present invention. As shown in FIG. 4, the delay circuit 40 comprises an N-bit counter (N is a positive integer), wherein a clock terminal CLK of the counter receives a clock signal with a cycle Tc. The value of N satisfies Td=2N×Tc configured to detect the status of comparative result signal COUT during the given delay period Td.

An enabling terminal D of the counter receives the comparative result signal COUT. A set terminal R1 of the counter is coupled to an output terminal of an inverter INV. An input terminal of the inverter INV receives the comparative result signal COUT. An output terminal OUT of the counter generates an output signal Qn. Delay circuit further comprises a latch, wherein a first set terminal S of the latch is coupled the output terminal of the counter to receive the output signal Qn, and wherein a second set terminal R2 is also coupled to the output terminal of the inverter INV. The latch generates the delay signal DOUT.

When the protected circuit is in normal, the comparative result signal COUT is at low level, COUT=0 when EN=1. Hence the counter is disabled, and the signal COUT resets the latch through the inverter INV. The latch generates a low level delay signal, DOUT=0 and the failure protection circuit is disabled. When the protected circuit is in failure, the comparative result signal COUT is at high level, COUT=1. Hence the comparative result signal enables the counter to start counting. The counter generates a pulse signal that has a cycle N×Tc, configured to set the latch. The latch generates a high level delay signal DOUT, DOUT=1 thus initiating the failure protection circuit.

Figure 5:
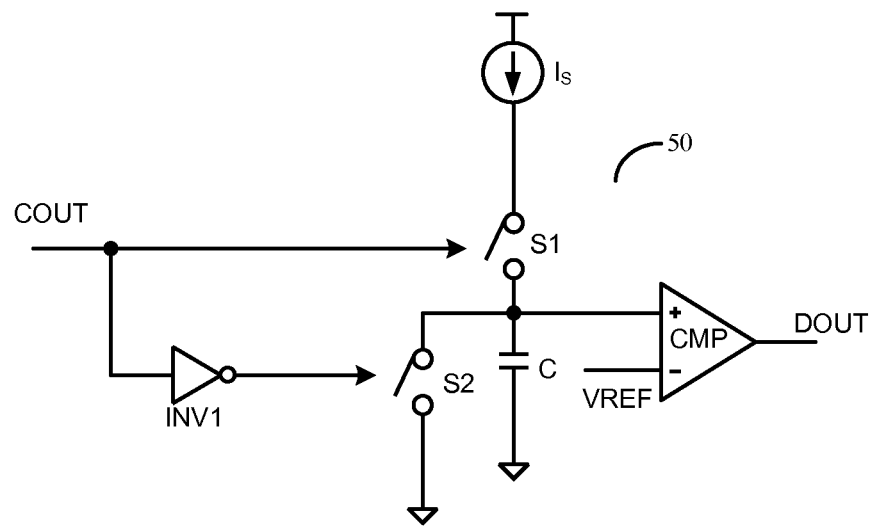
FIG. 5 schematically illustrates a circuitry of a delay circuit 50 according to another embodiment of the present invention.

FIG. 5 schematically illustrates a circuitry of a delay circuit 50 according to another embodiment of the present invention. Seen in FIG. 5, delay circuit 50 comprises a current source Is, a first switch S2, a second switch S2, a capacitor C, an inverter INV1 and a comparator CMP.

A first terminal of the first switch 51 is coupled to an output terminal of the current source Is, and a control terminal of the first switch 51 receives the comparative result signal COUT. A first terminal of the capacitor C is coupled to the second terminal of the first switch 51, and a second terminal of the capacitor C is connected to a reference ground. A first terminal of the second switch S2 is coupled to the common terminal for the first switch and the capacitor C, and a second terminal of the second switch S2 is coupled to the reference ground. The comparative result signal COUT is provided to a control terminal of the second switch through the inverter INV1. A non-inverting terminal of the comparator CMP is coupled to the common terminal for the first switch 51 and the capacitor C, while an inverting terminal of the comparator CMP receives the reference voltage VREF. Wherein, the reference voltage VREF is a positive voltage, and the comparator CMP generates the delay signal DOUT.

By properly setting the capacitance of C1 and the output current of the current source Is, the following equation could be satisfied:

$$T_d = \frac{C_C \cdot V_{REF}}{I_{IS}}$$

Wherein: Td is the given delay period; $I_{IS}$ is the output current of the current source Is; $C_C$ is the capacitance of the capacitor C. Once the protected circuit is in normal, COUT=1, the switch 51 is off and the switch S2 is on. The capacitor C is discharged. The comparator generates a low level delay signal DOUT. While the protected circuit is in failure, COUT=1, the switch 51 is on and the switch S2 is off. The capacitor C1 is charged by the current source Is. At the end of the given delay period Td, the voltage across the capacitor C equals to the reference voltage VREF. Thus the comparator generates a high level delay signal DOUT configured to initiate the failure protection circuit.

In the above embodiment, when EN is set disabled, the comparative result signal COUT is originally set to high level. However, one with ordinary skill in relevant art should understand that in other embodiments, when EN is set disabled, the comparative result signal COUT may originally be set to low level.

The failure detector circuit according to the embodiments of the present invention may be utilized in the application of rechargeable battery, switch mode power supply and etc, and may be integrated into protection circuit or independent from protection circuit.

Figure 6:
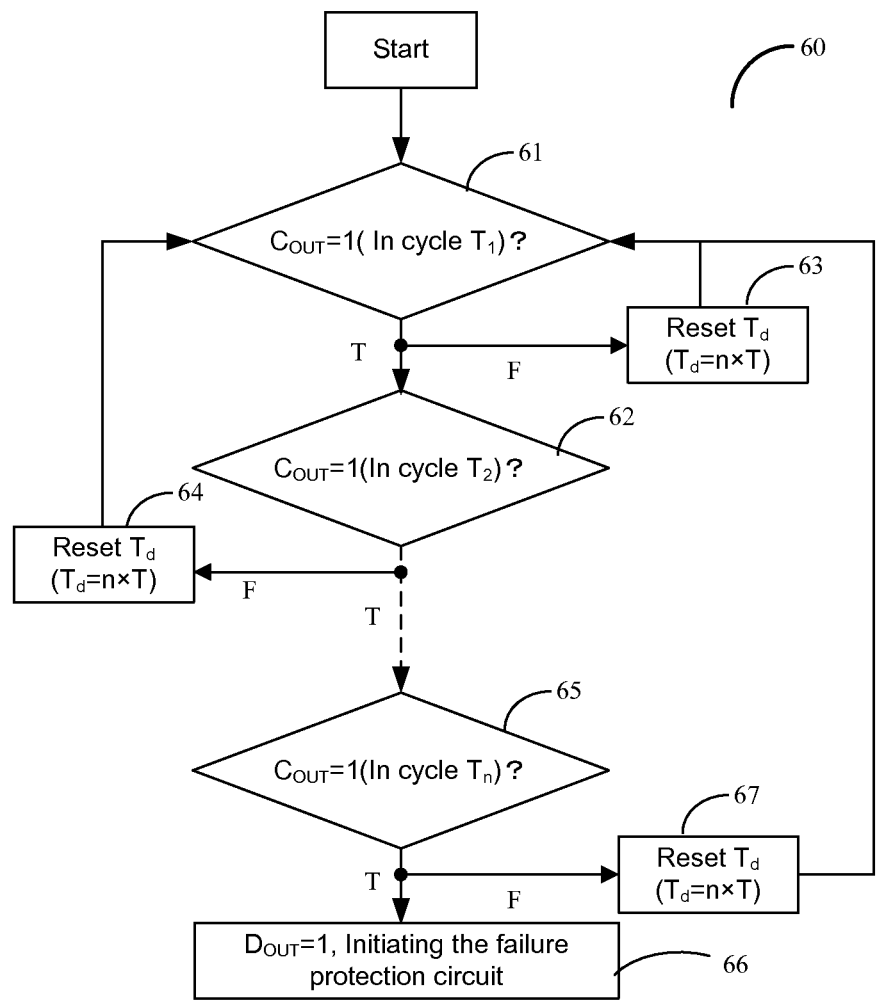
FIG. 6 schematically illustrates a method for detecting failure in circuit according to an embodiment of the present invention.

FIG. 6 schematically illustrates a method for detecting failure in circuit according to an embodiment of the present invention. As shown in FIG. 6, a step 61 comprises monitoring a voltage level of a comparative result signal COUT1. If COUT1 is at high level, it is latched. After an operating cycle T (a first cycle) passes, a step 62 is entered. Step 52 comprises detecting an output signal S of a protected circuit, and then comparing the output signal S and a reference signal R configured to obtain a comparative result signal COUT2 during a enable time Te of a second cycle. If the comparative result signal COUT2 is still at high level, then the comparative signal COUT2 is latched. When the second cycle ends, the step 62 is repeated. After an nth cycle ends, a step 65 which is the same as step 62 is completed. If during these n cycles, that is, during the given delay period Td=n×T, the detected comparative result signals COUT1, COUT2, . . . , COUTn are all high level signals, a step 66 which comprises initiating a failure protection circuit is entered. Wherein, n is an integer larger than 1. While if at least one of comparative result signals COUT, COUT2, . . . , COUTn is low level signal, corresponding step 63, 64 or 67 would be entered to reset the given delay period Td and recheck the status of the protected circuit.

The above description and discussion about specific embodiments of the present invention is for purposes of illustration. However, one with ordinary skill in the relevant art should know that the invention is not limited by the specific examples disclosed herein. Variations and modifications can be made on the apparatus, methods and technical design described above. Accordingly, the invention should be viewed as limited solely by the scope and spirit of the appended claims.

We claim:

1. A failure detector circuit for detecting status of a protected circuit, the failure detector circuit comprising:
   an enabling signal generator, generating a periodic enabling signal which has an operating cycle, configured to indicate an enable time in every operating cycle;
   a comparator circuit, having an enabling terminal, two input terminals and an output terminal, wherein the enabling terminal is configured to receive the enabling signal, and wherein the two input terminals are configured to respectively receive an output signal from the protected circuit and a reference signal, and wherein the output terminal is configured to provide a comparative result signal according to the enabling signal, the output signal and the reference signal; and
   a delay circuit, receiving the comparative result signal and detecting the comparative result signal for a given delay period, generating a delay signal according to the comparative result signal, wherein the given delay period is larger than the operating cycle.

2. The failure detector circuit according to claim 1, wherein the enabling signal is a square wave signal.

3. The failure detector circuit according to claim 2, wherein the active state of the enabling signal is in high level.

4. The failure detector circuit according to claim 1, wherein the enable time is 1% of the operating cycle.

5. The failure detector circuit according to claim 1, wherein the comparative result signal is set to high level out of the enable time.

6. The failure detector circuit according to claim 1, wherein if the comparative result signal maintains at high level for the given delay period, the delay signal is configured to initiate a failure protection circuit.

7. The failure detector circuit according to claim 1, wherein the protected circuit is a battery circuit.

8. The failure detector circuit according to claim 1, wherein the output signal is configured to indicate a voltage of the protected circuit.

9. The failure detector circuit according to claim 1, wherein the output signal is configured to indicate a current of the protected circuit.

10. The failure detector circuit according to claim 1, wherein the output signal is configured to indicate a temperature of the protected circuit.

11. The failure detector circuit according to claim 1, wherein the delay circuit comprises:
    an inverter, having an input terminal and an output terminal, wherein the input terminal is coupled to the output terminal of the comparator circuit, configured to receive the comparative result signal;
    a counter, having a first input terminal, a second input terminal and an output terminal, wherein the first input terminal is coupled to the output terminal of the comparator configured to receive the comparative result signal, and wherein the second input terminal is coupled to the output terminal of the inverter; and
    a latch, having a set terminal, a reset terminal and an output terminal, wherein the set terminal is coupled to the output terminal of the counter, wherein the reset terminal is coupled to the output terminal of the inverter, and wherein the output terminal is configured to provide the delay signal.

12. The failure detector circuit according to claim 1, wherein the delay circuit comprises:
    a current source, generating a source current;
    an inverter, having an input terminal and an output terminal, wherein the input terminal is configured to receive the comparative result signal;
    a first switch, having a first terminal, a second terminal and a control terminal, wherein the first terminal is configured to receive the source current, and wherein the control terminal is configured to receive the comparative result signal;

a second switch, having a first terminal, a second terminal and a control terminal, wherein the first terminal is coupled to the second terminal of the first switch, wherein the second terminal is coupled to a reference ground, and wherein the control terminal is coupled to the output terminal of the inverter;

a capacitor, having a first terminal and a second terminal, wherein the first terminal is coupled to the second terminal of the first switch, and wherein the second terminal is coupled to the reference ground; and a comparator, having a non-inverting terminal, an inverting terminal and an output terminal, wherein the non-inverting terminal is coupled to the second terminal of the first switch, wherein the inverting terminal is configured to receive a first reference voltage, and wherein the output terminal is configured to provide the delay signal accordingly.

13. A method for detecting failure in a protected circuit, the method comprising:

detecting an output signal of the protected circuit within an enable time of every operating cycle, and comparing the output signal with a reference signal configured to obtain a comparative result signal; and monitoring the value of the comparative result signal for a given delay period, and accordingly generating a delay signal;

wherein the given delay period is longer than the operating cycle, and wherein the enable time is shorter than the operating cycle.

14. The method according to claim 13, wherein the enable time is 1% of the operation cycle.

15. The method according to claim 13, wherein generating a delay signal comprises:

generating a high level delay signal if the value of the comparative result signal keeps in high level for the given delay period; and generating a low level delay signal if the value of the comparative result signal is at low level for at least one operating cycle during the given delay period.

16. The method according to claim 15, further comprising initiating a failure protection circuit if a high level delay signal is generated.

17. The method according to claim 15, wherein generating a high level delay signal is when all n comparative result signals are in high level within the given delay period, wherein the given delay period is equal to n times of the operating cycle, and wherein n is an integer larger than 1.

18. The method according to claim 13, further comprising resetting the given delay period if the comparative result signal is at low level.

19. A failure detection and protection circuit, comprising:

a protected circuit, generating an output signal;

a failure detector circuit, receiving periodic enabling signal having an operating cycle and configured to indicate an enable time in every operating cycle, a reference signal and the output signal configured to generate a failure detecting signal;

a failure protection circuit, receiving the failure detecting signal, configured to protect the protected circuit;

wherein the failure detector circuit comprises:

a comparator, having an enabling terminal, two input terminals and an output terminal, wherein the enabling terminal is configured to receives the enabling signal, and wherein the two input terminals are configured to respectively receive the output signal and the reference signal, and further wherein the output terminal is configured to provide a comparative result signal accordingly;

a delay circuit, receiving the comparative result signal and monitoring the comparative result signal within a given delay period, configured to generate the failure detecting signal.

* * * * *